(12) United States Patent
Tandou et al.

(10) Patent No.: US 10,741,368 B2
(45) Date of Patent: Aug. 11, 2020

(54) PLASMA PROCESSING APPARATUS

(71) Applicant: HITACHI HIGH-TECH CORPORATION, Minato-Ku, Tokyo (JP)

(72) Inventors: Takumi Tandou, Tokyo (JP); Takamasa Ichino, Tokyo (JP); Kenetsu Yokogawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 132 days.

(21) Appl. No.: 16/110,525

(22) Filed: Aug. 23, 2018

(65) Prior Publication Data

US 2019/0244795 A1  Aug. 8, 2019

(30) Foreign Application Priority Data

Feb. 5, 2018  (JP) .................................. 2018-018324

(51) Int. Cl.
| | |
|---|---|
| *H01J 37/32* | (2006.01) |
| *H01L 21/67* | (2006.01) |
| *H01L 21/683* | (2006.01) |
| *H01L 21/687* | (2006.01) |

(52) U.S. Cl.
CPC .. *H01J 37/32724* (2013.01); *H01L 21/67069* (2013.01); *H01L 21/67103* (2013.01); *H01L 21/67109* (2013.01); *H01L 21/6833* (2013.01); *H01L 21/68742* (2013.01); *H01L 21/68757* (2013.01); *H01J 37/32229* (2013.01); *H01J 2237/002* (2013.01); *H01J 2237/18* (2013.01); *H01L 21/6831* (2013.01)

(58) Field of Classification Search
CPC ......... H01L 21/67069; H01L 21/68742; H01L 21/67103; H01L 21/67109; H01L 21/6833; H01L 21/6831; H01L 21/68757; H01J 37/32724; H01J 2237/31701; H01J 2237/18; H01J 2237/002; H01J 2237/2001; H01J 37/32229
See application file for complete search history.

(56) References Cited

U.S. PATENT DOCUMENTS

2003/0029572 A1  2/2003  Kanno et al.

FOREIGN PATENT DOCUMENTS

| JP | 2003-060019 A | 2/2003 |
|---|---|---|
| JP | 2010-021405 A | 1/2010 |

*Primary Examiner* — Yuechuan Yu
(74) *Attorney, Agent, or Firm* — Miles & Stockbridge, P.C.

(57) ABSTRACT

A plasma processing apparatus including: a processing chamber; a sample stage; a vacuum exhaust unit; and a plasma generation unit, the sample stage includes: a first metallic base material having a refrigerant flow path formed therein; a second metallic base material disposed above the first metallic base material and has a lower thermal conductivity than the first metallic base material; and a plurality of lift pins vertically moving the object to be processed with respect to the sample stage. A plurality of through-holes through which the plurality of the lift pins passes is formed in the first and the second metallic base material, and a boss, which electrically insulates the lift pin from the first and the second metallic base material and is formed using an insulating member having a higher thermal conductivity than the second metallic base material, is inserted into each of the plurality of through-holes.

13 Claims, 4 Drawing Sheets

PLASMA PROCESSING APPARATUS

CLAIM OF PRIORITY

The present application claims priority from Japanese Patent Application JP 2018-18324 filed on Feb. 5, 2018, the content of which is hereby incorporated by reference into this application.

BACKGROUND OF THE INVENTION

The invention relates to a plasma processing apparatus that processes a substrate-like sample, such as a semiconductor wafer, which is used during a process of manufacturing a semiconductor device and is placed on a sample stage disposed in a processing chamber inside a vacuum container, using plasma formed in the processing chamber, and particularly to a plasma processing apparatus that processes a sample placed on a sample stage while keeping an in-plane temperature of the sample at a desired value.

Along with the trend of miniaturization of semiconductor devices, the accuracy required for an etching process, which is necessary to manufacture the semiconductor devices, becomes strict year by year. In order to deal with such a problem, it is important to control a surface temperature of a sample within a range of a desired value during etching in a plasma processing apparatus that performs an etching process on a semiconductor wafer using plasma inside a vacuum container.

In recent years, the etching process is performed in a plurality of steps in the state of holding one sample on a sample stage in response to a request for further improvement of shape accuracy. There is a demand for a technique of controlling a surface temperature distribution of the sample to be optimum for each step condition during the process.

In general, an upper surface of a sample stage provided in a plasma processing apparatus has an electrostatic chuck structure. That is, a configuration in which electric power is supplied to an electrode, disposed inside a film-shaped dielectric material constituting an upper surface of the sample stage, to adsorb and hold a wafer placed on the film by static electricity is provided, and further, a heat transfer medium such as a He gas is supplied between a back surface of the wafer and a film surface to promote heat transfer between the wafer and the sample stage even in vacuum.

Further, a cooling means using a refrigerant flow path through which a heat transfer medium (refrigerant) such as water and a coolant flows and a heating means such as a heater are disposed inside a member disposed inside the sample stage in order to control a temperature of a placement surface of the sample stage on which the wafer is placed within a desired range. The temperatures of the placement surface of the sample stage and the wafer are controlled by increasing or decreasing a heat exhaust amount by the cooling means and a heating amount by the heating means. For example, in a typical plasma etching processing apparatus, a temperature of a wafer is controlled to a value within a range suitable for processing by controlling an output of a heater while allowing a refrigerant whose temperature has been controlled to a value within a predetermined range by a refrigerant temperature control device such as a chiller device to flow in a refrigerant flow path inside a sample stage.

The wafer being plasma-processed is heated by ion incidence or the like from plasma. In addition, the wafer is heated by receiving heat from an upper surface of the sample stage on which the wafer has been placed even when the heating means such as the heater is disposed inside the sample stage. At this time, it is desirable that a distribution of magnitude of heat transfer inside the sample stage be one desired by a user in terms of controlling a temperature value and a distribution thereof to values within a desired range with respect to an in-plane direction of the wafer. However, in practice, the distribution of magnitude of heat transfer tends to be non-uniform in the in-plane direction by being affected by the influence of an internal structure such as a shape of the refrigerant flow path disposed inside the sample stage, and such influence of the structure becomes an impediment factor in controlling the wafer temperature to the value suitable for processing.

More specifically, when a flow path that allows a refrigerant to flow therethrough is disposed inside a metallic base material disposed inside a cylindrical sample stage, it is physically difficult to dispose the flow path so as to have uniform positions in a radial or peripheral direction over the entire in-plane direction of an upper surface of a circular or substantially circular shape of the sample stage.

This is because not only the refrigerant flow path but also parts and structures disposed for other purposes, for example, cables and connectors for supplying power to adsorb the substrate-like sample to be processed such as the semiconductor wafer placed on the upper surface by static electricity and power to cause the heater to generate heat, cables or connectors for supplying radio-frequency power of a predetermined frequency supplied to an electrode disposed in a dielectric film constituting the base material or the upper surface on which the sample is placed, a passage for supplying a gas having heat transferability such as He, which is supplied to a gap between the upper surface of the sample stage and the sample placed and adsorbed onto the sample stage, a through-hole in which a plurality of pins that moves the sample upward or downward, the sample in the state of being placed at a distal end of the pin and supported above the upper surface of the sample stage, is disposed and vertically moves, and the like are disposed inside the sample stage including the base material, and when preferable positions for disposing these parts and a preferable position for disposing the refrigerant flow path overlap each other, one or both of them are disposed at a location deviating from the preferable position so as to satisfy specifications required by the user such as a customer in consideration of the performance of sample processing.

Conventionally, such a trade-off in terms of design has always been selected in determining a structure of a device to be manufactured. In a general plasma processing apparatus, a portion where a refrigerant flow path is non-uniformly disposed in the radial direction or the peripheral direction is generated in the in-plane direction of the upper surface of the sample stage. Representative examples of the portion of the refrigerant flow path disposed in the vicinity thereof include an inlet and an outlet of the refrigerant. In regions inside and the upper surface of the base material in the vicinity of such portions, a heat exchange amount caused by the refrigerant (the amount of heat exhaust in case of cooling the sample) tends to become non-uniform in the radial or peripheral direction.

Conventionally, a technique disclosed in JP 2003-60019 A is known as a technique for solving such a problem. This conventional technique discloses a wafer stage on which a semiconductor wafer is mounted and which includes: a base material having a refrigerant flow path for allowing a refrigerant for temperature adjustment to flow; a stress-reducing member provided on a wafer setting side of the base material and having a smaller thermal expansion coefficient than the base material; a dielectric film provided on the wafer setting side of the stress-reducing member; and a deflection-preventing member provided on a wafer non-setting side of the base material and having a smaller thermal expansion coefficient than the base material.

In this conventional technique, breakage of the dielectric film due to a difference in linear expansion coefficient between the base material and the dielectric film is suppressed by disposing the stress-reducing member between the base material and the dielectric film. Titanium as a material of the stress-reducing member, aluminum as the base material, and titanium as the deflection-preventing member are disclosed.

In addition, JP 2010-21405 A discloses a vacuum processing apparatus having a lift pin housed inside a through-hole disposed on a sample stage to raise and lower an object to be processed. The vacuum processing apparatus is configured such that an outer peripheral edge of a portion on a tray at a distal end of the lift pin is brought into close contact with the periphery of the through-hole on an upper surface of the sample stage during processing of the object to be processed to hermetically close the through-hole so that it is possible to prevent heat conduction between a space inside the through-hole and the object to be processed above the through-hole from becoming singularity locally different from other portions and to obtain heat transfer with small variations over the entire upper surface of the sample stage.

SUMMARY OF THE INVENTION

However, the above-described conventional techniques still have the problems with insufficient consideration for the following points.

First, in the conventional technique of JP 2003-60019 A, the refrigerant flow path is disposed in the base material of aluminum having a high thermal conductivity, and it is possible to suppress deviation of a local temperature from an intended one to some extent by the non-uniform arrangement of the flow path shape, but there is no consideration on the influence of a power supply path disposed on the sample stage and the through-hole in the vertical direction for the pin or for the supply of a liquid, and there is a risk that it is difficult to suppress non-uniformity of the temperature in the sample stage having such a structure.

In addition, in the conventional technique of JP 2010-21405 A, there is still thermal resistance caused by a member at a distal end portion in the tray-shaped or a large-diameter portion disposed at the distal end of the pin contacting the upper surface or an upper part of the sample stage even if the gas having heat transferability such as He is supplied into the through-hole for the pin, and thus, the temperature of the lift pin portion rises when the amount of heat supplied from the plasma is large. Further, it is difficult to incorporate an electrode for an electrostatic chuck into the large-diameter portion or the dish-shaped portion of the pin, and thus, an electrostatic force for electrostatically adsorbing the object to be processed on the portion to the sample stage locally decreases. In addition, it is difficult to dispose a heater on the sample stage at the portion, and there is a risk that the portion locally becomes a region where it is difficult to set the temperature of the object to be processed to a desired value in a configuration in which the temperature of the object to be processed is controlled by heating using the heater.

As described above, the amount of heat transfer locally varies due to the internal structure of the sample stage so that the values of the temperature of the sample being processed placed on the upper surface of the sample stage and its distribution deviate from intended ones, and there is no consideration on a problem of impairment in accuracy and a yield of wafer processing in the conventional techniques.

An object of the invention is to provide a plasma processing apparatus capable of improving a processing yield and improving processing accuracy.

In order to solve the above-described problem, according to an aspect of the invention, in a plasma processing apparatus including: a processing chamber which is formed using a vacuum container; a sample stage which is installed inside the processing chamber and on which an object to be processed is placed; a vacuum exhaust unit which includes a vacuum pump and exhausts an inside of the processing chamber to vacuum; and a plasma generation unit which includes a power supply and generates plasma inside the processing chamber, the sample stage includes: a first metallic base material which has a flow path of a refrigerant formed therein; a second metallic base material which is disposed above the first metallic base material and has a lower thermal conductivity than the first metallic base material; an insulating film layer which is formed using an insulating member covering a surface of the second metallic base material, has an electrode formed therein, and adsorbs the object to be processed, placed on an upper surface of the insulating film layer, by an electrostatic force; and a plurality of lift pins which vertically moves the object to be processed with respect to the upper surface of the insulating film layer in a state where the adsorption by the electrostatic force is stopped. Further, a plurality of through-holes through which the plurality of the lift pins passes is formed in the first metallic base material, the second metallic base material, and the insulating film layer, and a boss, which electrically insulates the lift pin from the first metallic base material and the second metallic base material and is formed using an insulating member having a higher thermal conductivity than the second metallic base material, is inserted into each of the plurality of through-holes.

According to the invention, the base material of the sample stage has the multilayer structure, the flow path is formed in a lower layer of the high thermal conductivity material, the insulating boss installed in the through-hole of the base material is brought into thermal contact with the lower layer, and the thermal conductivity of the insulating boss is set to be higher than that of an upper layer. As a result, it is possible to increase a heat exhaust amount from the insulating boss and to suppress non-uniformity of in-plane heat exhaust distribution of a sample.

At this time, there is a concern on breakage of the insulating boss due to a thermal expansion difference between the respective layers of the base material, and thus, the breakage of the insulating bosses provided on the multi-layer base material is suppressed by providing a gap between the lower layer having a large linear expansion coefficient and the insulating boss and filling the gap with a soft adhesive layer for heat transfer, whereby it is possible to realize the sample stage which is resistant to repeated heating cycles necessary for the plasma processing apparatus.

DESCRIPTION OF THE PREFERRED EMBODIMENTS

Figure 1:
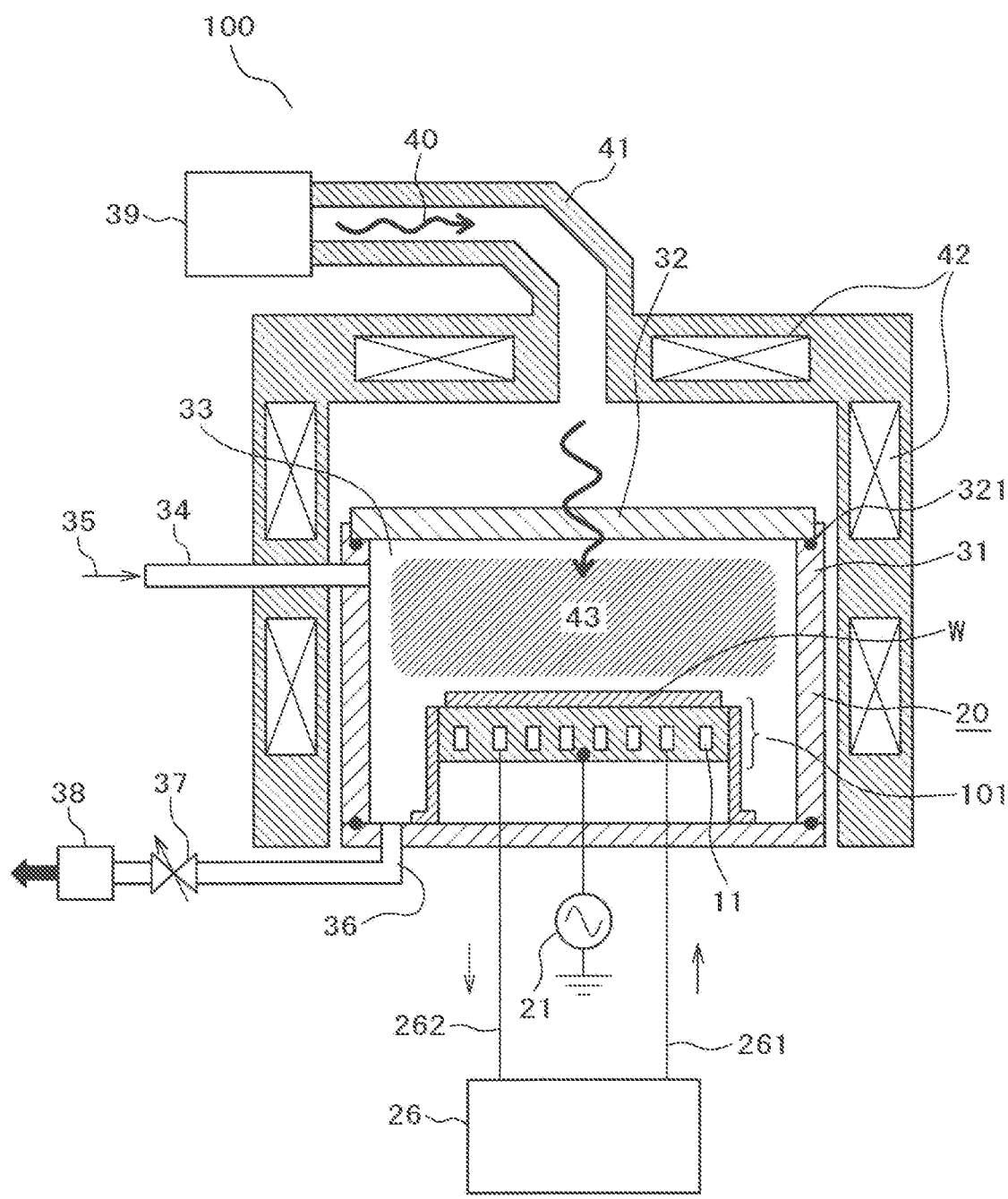
FIG. 1 is a vertical cross-sectional view of a plasma processing apparatus schematically describing an outline of a configuration of the plasma processing apparatus according to an embodiment of the present invention.

The invention relates to a plasma processing apparatus including: a processing chamber which is formed using a vacuum container and in which plasma is formed; a sample stage disposed below the processing chamber and on which a wafer to be processed using the plasma is placed; and a metallic base material having a circular plate or a cylindrical shape disposed inside the sample stage.

The metallic base material of the plasma processing apparatus according to the invention includes a lower member which is made of a material having a relatively high thermal conductivity and has a refrigerant flow path through which a refrigerant for cooling the base material flows, and an upper member which is made of a material having a relatively low thermal conductivity and is connected to the lower member above the lower member, and has a configuration in which a through-hole through which a pin for vertically moving the wafer on the upper surface of the sample stage is disposed is formed to penetrate through the lower member and the upper member of the base material, and a boss made of an insulating material having a thermal conductivity higher than the thermal conductivity of the upper member is mounted inside the through-hole.

Embodiments of the invention will be described with reference to the drawings hereinafter. The same reference numerals will be attached to those having the same function in the entire drawing for describing the embodiments, and the repetitive description thereof will be omitted in principle. However, the invention is not construed as being limited to contents of the embodiments to be described below. Those skilled in the art can easily understand that specific configurations can be changed without departing from a spirit or a gist of the invention.

Embodiment

An embodiment of the invention will be described with reference to FIGS. 1 to 5. The embodiment relates to a plasma processing apparatus such as an etching processing apparatus, and relates to a relative arrangement of a boss, fitted into a through-hole such as a lift pin hole of a metallic electrode block (base material) disposed inside a sample stage used in a processing chamber, and the electrode block and material configurations thereof.

Specifically, the electrode block is constituted by a plurality of layers of members in order to suppress deformation accompanying a temperature change, is configured such that (a thermal conductivity of the boss)>(a thermal conductivity of an upper layer) is set under (a thermal conductivity of the upper layer)<(a thermal conductivity of the lower layer) to increase a heat transfer amount to a lower layer, and a thermal conductivity of an adhesive layer, inserted between the boss and the through-hole of the electrode block of the sample stage having such a multilayer concept is set to be larger than that of the upper layer, or is configured such that (a rigidity of the adhesive layer for the boss of the upper layer)>(a rigidity of the adhesive layer of the lower layer).

FIG. 1 is a vertical cross-sectional view schematically describing an outline of a configuration of the plasma processing apparatus according to the embodiment of the invention. In particular, the plasma processing apparatus of FIG. 1 illustrates a plasma etching apparatus in which a microwave-band electric field and a magnetic field formed by a coil disposed around a vacuum container are introduced into a processing chamber disposed inside the vacuum container through a waveguide and which causes a processing gas supplied into the processing chamber to be excited by electron cyclotron resonance (ECR) caused by interaction between the electric field and the magnetic field to form plasma.

In FIG. 1, a plasma processing apparatus 100 is configured to include: a vacuum container 20 with a cylindrical processing chamber 33 whose interior is depressurized to a predetermined vacuum degree suitable for processing formed therein; a plasma formation unit which is disposed around an upper side and a side of the vacuum container 20 to form and supply an electric field or a magnetic field for forming plasma inside the processing chamber 33; and an exhaust unit which is disposed below the vacuum container 20, disposed to communicate with the inside of the processing chamber 33 through an exhaust port 36 at the bottom of the processing chamber 33, and includes a vacuum pump such as a turbo molecular pump 38.

The vacuum container 20 includes: a metallic processing chamber wall 31 having a cylindrical shape disposed to surround the outer periphery of the cylindrical processing chamber 33; and a lid member 32 having a disk shape which is placed on an upper end of the circular shape and is configured to include a dielectric body, such as quartz glass, capable of transmitting a microwave-band electric field.

A lower surface of an outer peripheral edge of the lid member 32 and the upper end of the processing chamber wall 31 are connected or coupled with a seal member 321 such as an O-ring sandwiched therebetween so that the seal member 321 is deformed and the inside of the processing chamber 33 is hermetically sealed against the outside of the processing chamber 33.

In an inner lower part of the processing chamber 33, there is disposed a sample stage 101 having a cylindrical shape on which a substrate-like sample (hereinafter referred to as a wafer W) such as a semiconductor wafer, which is a sample to be processed, is placed above an upper surface of the circular shape. Further, there is a discharge portion which is an upper part of the processing chamber 33 above the sample stage 101 and is a space where plasma is formed. A gas introducing pipe 34 having an opening to introduce a processing gas 35 for performing an etching process into the processing chamber 33 is connected to an upper part of the vacuum container 20 surrounding the discharging portion.

The exhaust port 36 is disposed on a bottom surface of the processing chamber 33 below the sample stage 101. The exhaust port 36 communicates with an inlet of the turbo molecular pump 38, which is disposed below the bottom of the sample stage 101 and constitutes the exhaust unit, via an exhaust conduit. The processing gas 35 introduced into the processing chamber 33, a reaction product generated by etching, and particles generated by plasma 43 are exhausted through the exhaust port 36.

A pressure control valve 37 is disposed on a conduit connecting the exhaust port 36 of the processing chamber 33 and the turbo molecular pump 38. A flow rate or speed of exhaust of the processing chamber 33 through the exhaust port 36 is controlled by controlling an opening degree of the pressure control valve 37 to be increased or decreased in accordance with a command signal from a control device (not illustrated), the pressure inside the processing chamber 33 is controlled to a value within a predetermined range. In the embodiment, the pressure inside the processing chamber 33 is controlled to a predetermined value within a range of several Pa to several tens of Pa.

Above the processing chamber 33, there are provided a waveguide 41 constituting the plasma formation unit and a microwave oscillator 39 such as a magnetron which is disposed at an end of the waveguide 41 and forms a microwave electric field 40. The microwave electric field 40 generated by the microwave oscillator 39 is introduced into the waveguide 41 and propagates through a portion having a rectangular cross section and a portion having a circular cross section connected thereto. A mode of a predetermined electric field is amplified in a space for resonance connected to a lower end of the waveguide 41 and having a cylindrical shape with a larger diameter than the waveguide 41, and the electric field of the mode passes through the lid member 32 which is disposed above the processing chamber 33 and constitutes an upper part of the vacuum container 20 and is introduced into the processing chamber 33 from above.

A solenoid coil 42 disposed above the lid member 32 and around an outer wall of the processing chamber wall 31 so as to surround the lid member 32 and the processing chamber wall 31 is provided, and the solenoid coil 42 is connected to a power supply (not illustrated). When a current is caused to flow to the solenoid coil 42 by the power supply (not illustrated), the solenoid coil 42 generates a magnetic field, and the magnetic field generated by the solenoid coil 42 is introduced into the processing chamber 33.

Atoms or molecules of the processing gas 35 introduced into the processing chamber 33 are excited by ECR caused by interaction between the microwave electric field 40 and the magnetic field generated by the solenoid coil 42 to be ionized or dissociated, so that the plasma 43 is generated inside the space of the processing chamber 33 above the sample stage 101 or the wafer W above the upper surface of the sample stage 101.

The plasma 43 faces the wafer W, and the base material also serving as the metal electrode block in the sample stage 101 as described above is electrically connected to a radio-frequency power supply 21 and is supplied with radio-frequency power of a predetermined frequency output from the radio-frequency power supply 21 so that charged particles in the plasma 43 are attracted to an upper surface of the wafer W by a bias potential generated on the wafer W, and the etching process is performed on a film layer to be processed having a film structure which has been disposed in advance on the upper surface of the wafer W.

In the embodiment, a configuration of controlling temperature of the sample stage 101 is provided in order to realize temperature of the wafer W within a range suitable for processing during the processing of the wafer W. A temperature control unit 26, such as a chiller, which is disposed outside the vacuum container 20 and has a function of controlling a temperature of the refrigerant to a value within a set range, and a refrigerant flow path 11 disposed inside a metallic base material 202 of the sample stage 101 are connected by conduits 261 and 262 to form a circulation path.

The refrigerant whose temperature has been controlled by the temperature control unit 26 is supplied to the refrigerant flow path 11 inside the sample stage 101 through the conduit 261, heat exchange is performed between the refrigerant passing through the inside of the refrigerant flow path 11 and the sample stage 101 thermally connected to the wafer W, and this refrigerant returns to the temperature control unit 26 through the conduit 262, whereby the temperature of the sample stage 101 and the temperature of the wafer W placed thereon are controlled to values within desired ranges.

The wafer W is carried into the processing chamber 33 of the vacuum container 20 by extension of a robot arm (not illustrated) in the state of being placed on an arm distal end of the arm, which has a plurality of arm members disposed in a transfer chamber and having both ends connected by a joint portion, from the transfer chamber of a vacuum transfer container, which is another vacuum container (not illustrated) connected to a side wall of the vacuum container 20 so as to communicate with the vacuum container 20 and includes the transfer chamber having a decompressed inside in which the wafer W is transferred, and is transferred above the upper surface of the sample stage 101.

When the wafer W is delivered onto a lift pin (not illustrated) of the sample stage 101, the arm contracts to be withdrawn from the processing chamber 33 and the lift pin descends while placing the wafer W and is housed in the sample stage 101, and then, the wafer W is placed on a placement surface, which is the upper surface of the sample stage 101, having a circular shape or a shape approximate to the extent that it can be regarded as the circular shape. FIG. 1 illustrates a state where the wafer W is placed on the sample stage 101 in this manner.

Figure 2A:
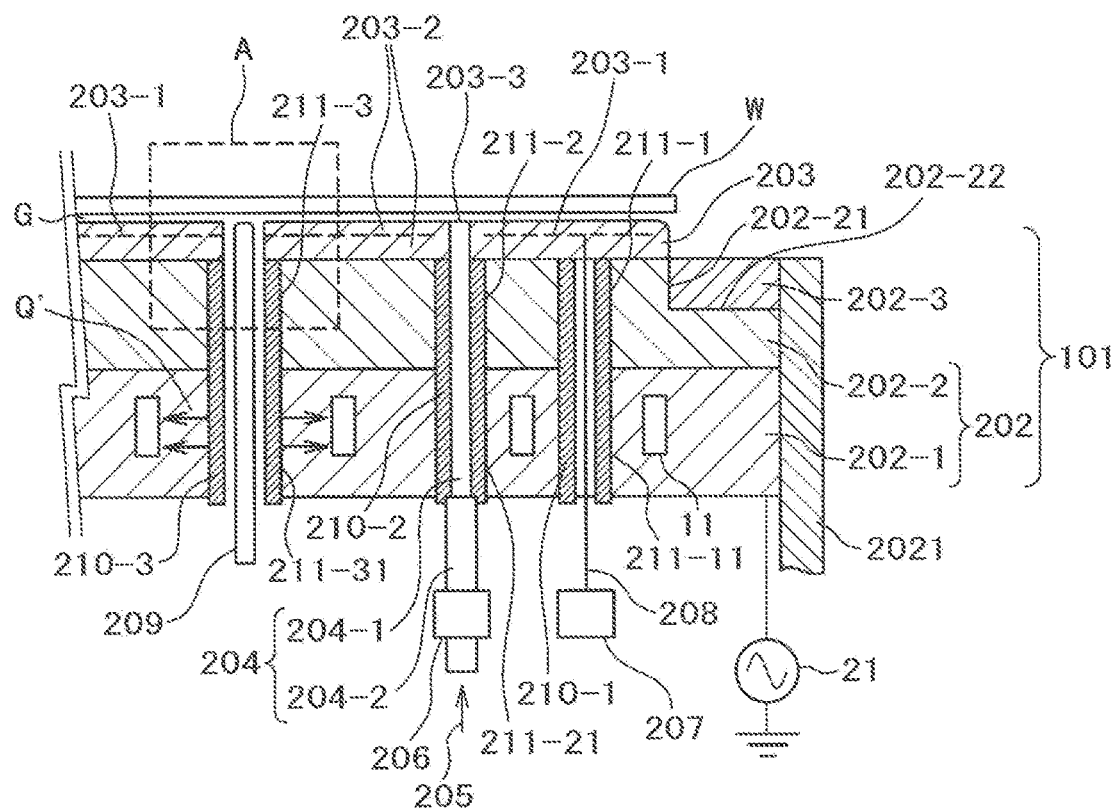
FIG. 2A is a cross-sectional view schematically illustrating an outline of a configuration of a sample stage of the plasma processing apparatus according to the embodiment of the invention.

FIG. 2A illustrates a detailed configuration of the sample stage 101. The sample stage 101 according to the embodiment is formed to include an electrode block 202 constituting a metallic base material having a cylindrical or circular shape and disposed inside the sample stage 101 and an electrostatic adsorption layer 203 which is a dielectric film covering an upper surface of the electrode block 202.

The electrostatic adsorption layer 203 includes an internal electrode 203-1 which is a film-shaped member made of a conductor and disposed inside the electrostatic adsorption layer 203, and a film-shaped insulator 203-2 disposed so as to cover the top and bottom of the internal electrode 203-1. Tungsten is used in the embodiment as a material of the internal electrode 203-1, ceramics such as alumina ceramics and yttrium having a plasma resistance are used as a material of the insulator.

The film-shaped internal electrode 203-1 disposed inside the electrostatic adsorption layer 203, which is the dielectric film constituting the placement surface on which the wafer W of the sample stage 101 is mounted, is electrically connected to a DC power supply 207. DC power is supplied from the DC power supply 207 to the internal electrode 203-1, and the wafer W is adsorbed and held on the electrostatic adsorption layer 203 which is the dielectric film by an electrostatic force generated as a result of charge accumulation inside the insulating film 203-2 disposed above the internal electrode 203-1 and inside the wafer W above the insulating film 203-2.

In the refrigerant flow path 11 formed in the electrode block 202 which is the metallic base material of the sample stage 101, a refrigerant, which is a heat exchange medium controlled to a temperature within a predetermined range inside the temperature control unit 26, is circulated and supplied. As a result, the temperature of the sample stage 101 or the electrode block 202, which is the metallic base material, is set to a temperature within a range of a value suitable for starting processing on the wafer W adsorbed and held on the electrostatic adsorption layer 203.

In this state, a gas having heat transferability such as He is supplied, through an opening 203-3 formed in the electrostatic adsorption layer 203, to a gap G between an upper surface of the electrostatic adsorption layer 203 which is the dielectric film and the wafer W electrostatically adsorbed to the upper surface of the electrostatic adsorption layer 203. The gas having heat transferability such as He is supplied from a gas supply source (not illustrated) through a heat transfer gas supply passage 204 communicating with the opening 203-3.

In such a configuration, heat transfer between the wafer W and the sample stage 101 including the electrostatic adsorption layer 203 is promoted as the gas having heat transferability such as He is supplied to the gap G between the upper surface of the electrostatic adsorption layer 203 and the wafer W electrostatically adsorbed to this upper surface.

In this state, the processing gas 35 is introduced into the processing chamber 33 through the gas introducing pipe 34 by controlling using a control unit (not illustrated) in the configuration illustrated in FIG. 1, and the microwave electric field passed through the lid member 32 and the magnetic field from the solenoid coil 42 are formed inside the processing chamber 33. As a result, the plasma 43 is formed using the processing gas 35 inside the processing chamber 33 by the interaction between the microwave electric field and the magnetic field.

In a state where the plasma 43 is generated inside the processing chamber in this manner, the radio-frequency power of the predetermined frequency from the radio-frequency power supply 21 is applied to the electrode block 202 constituting the sample stage 101. As a result, the bias potential is formed above the upper surface of the wafer W, and charged particles such as ions in the plasma 43 are attracted to and collide with the upper surface of the wafer W depending on a potential difference from a potential of the plasma 43. As a result, the wafer W is subjected to the etching process. On the upper surface of the wafer W, a plurality of film layers including a film layer to be processed on the outermost surface is stacked and formed, and a mask pattern using a resist is formed on the film layer to be processed.

When it is detected that the etching process reaches an end point by a detector (not illustrated) using a known technique such as emission spectrometry of the plasma 43, the supply of the radio-frequency power from the radio-frequency power supply 21 to the electrode block 202, the supply of the microwave electric field 40 from the microwave oscillator 39, and the supply of the magnetic field from the solenoid coil 42 are stopped by control of the control unit (not illustrated) so that the plasma 43 in the processing chamber 33 is extinguished and the etching process is stopped. Thereafter, the wafer W is carried out of the processing chamber 33 by a transfer means (not illustrated), and cleaning in the processing chamber 33 is performed.

As illustrated in FIG. 2A, the electrode block 202 is formed in a two-layer structure of a lower layer 202-1 and an upper layer 202-2. The upper layer 202-2 has a cylindrical convex portion 202-21 constituting the placement surface on which the wafer W is placed and a cylindrical base portion 202-22 having a larger diameter than the convex portion 202-21.

An upper surface of the convex portion 202-21 of the upper layer 202-2 has a circular shape or a shape approximate to the extent that it can be regarded as the circular shape, and the electrostatic adsorption layer 203, which is the dielectric film disposed to cover the upper surface and joined to the upper surface of the convex portion 202-21 is formed on the upper surface. As described above, the electrostatic adsorption layer 203 includes the internal electrode 203-1 which is the film-shaped member made of the conductor and disposed inside the electrostatic adsorption layer 203, and the film-shaped insulator 203-2 disposed so as to cover the top and bottom of the internal electrode 203-1. Tungsten is used in the embodiment as a material of the internal electrode 203-1, ceramics such as alumina ceramics and yttrium having a plasma resistance are used as a material of the insulator.

The electrostatic adsorption layer 203 of this embodiment may be formed by a thermal spray method of blowing particles of a material of ceramics or metal in a semi-molten state formed by a heating means such as plasma to cover the upper surface of the electrode block 202 so as to be deposited in a film shape, and may be formed using a sintered plate obtained by forming a material such as ceramics in the state of including a metallic film to form the internal electrode 203-1 therein into a film shape and then sintering the film-shaped material and molding the sintered material into a plate shape.

The upper surface of the convex portion 202-21 of the upper layer 202-2 of the electrode block 202 and the electrostatic adsorption layer 203 are joined to each other to constitute an integral member by the process of blowing particles to be deposited in the film shape in the former case, and by an adhesive disposed between the sintered plate and the upper surface of the electrode block 202 or a member disposed on the electrode block 202 in the latter case. The surface (the surface on which the wafer W is placed) of the electrostatic adsorption layer 203 formed by the thermal spray method or the sintered plate is relatively rough and has unevenness formed thereon.

The heat transfer gas supply passage 204, which allows a heat transfer gas 205 having heat transferability, such as He, supplied from the opening 203-3 on the upper surface of the electrostatic adsorption layer 203 to flow into the gap G formed mainly by the relatively rough unevenness of the surface of the electrostatic adsorption layer 203 between the back surface of the wafer W and the surface of the electrostatic adsorption layer 203, is disposed on the sample stage 101. The heat transfer gas supply passage 204 is formed to penetrate through the electrode block 202 and the electrostatic adsorption layer 203.

In a state where the wafer W is placed to be electrostatically adsorbed and held on the placement surface for the wafer W of the electrostatic adsorption layer 203, the heat transfer gas 205 that has been supplied from a gas supply means (not illustrated) is supplied to the gap G between the back surface of the wafer W and the surface of the electrostatic adsorption layer 203. The heat transfer gas supply passage 204 of the embodiment is configured to include a passage 204-1 which is a portion inside the electrode block 202 communicating with the opening 203-3 on the upper surface of the electrostatic adsorption layer 203 and a gas line 204-2 extending downward from a bottom surface of the sample stage 101.

Since the heat transfer gas 205 is supplied and exists in the gap G between the back surface of the wafer W and the surface of the electrostatic adsorption layer 203, the heat transfer between the wafer W and the sample stage 101 (electrode block 202) is promoted even inside the processing chamber 33 which is exhausted and set to a predetermined degree of vacuum, and it is easy to maintain the temperature of the wafer W at the value within the desired range. In the embodiment, a flow rate or speed of supply of the heat transfer gas 205 is adjusted by controlling a flow rate control valve 206 disposed on the heat transfer gas supply passage 204 by the control unit (not illustrated) using an output from a flow meter (not illustrated) that detects the flow rate of the heat transfer gas 205.

In the sample stage 101 of the embodiment, a cover ring 202-3 made of ceramics such as quartz, alumina, and yttrium is disposed at a stepped portion 202-22 at an outer peripheral edge of the cylindrical convex portion 202-21 of the upper layer 202-2 of the electrode block 202. The cover ring 202-3 covers a side surface of the cylindrical convex portion 202-21 of the upper layer 202-2 and an upper surface of the stepped portion 202-22. The cover ring 202-3 and the outer peripheral portion of the electrode block 202 are covered with a cover 2021 whose surface is covered with an insulator.

With such a configuration, the electrode block 202 installed inside the processing chamber 33 does not come into direct contact with the plasma 43, and it is suppressed that the electrode block 202 is scraped off due to the interaction with the plasma 43 or that products adhere to the electrode block 202.

In addition, the internal electrode 203-1 disposed inside the electrostatic adsorption layer 203 is electrically connected to the DC power supply 207 disposed outside the sample stage 101 via a power supply line 208. Polarized charges are generated inside the insulator 203-2 between the DC power supply 207 and the wafer W by a voltage generated in the internal electrode 203-1 to which the DC power has been supplied from the DC power supply 207, and as a result, the electrostatic force is generated between the electrostatic adsorption layer 203 and the wafer W. Due to this electrostatic force, a force for adsorbing the wafer W in the direction of the upper surface of the electrostatic adsorption layer 203 acts on the wafer W.

Incidentally, the power of the DC power supply 207 passes through a hollow insulating boss 210 disposed inside holes 211-1 and 211-11 penetrating through the electrode block 202 and is supplied to the internal electrode 203-1 of the electrostatic adsorption layer 203 via the power supply line 208 constituted by cables and connectors.

The internal electrode 203-1 is constituted by a plurality of film-shaped electrodes, insulated by arranging a dielectric material constituting the electrostatic adsorption layer 203-2 therebetween, using so-called bipolar electrostatic adsorption electrode in which different polarities are imparted between adjacent electrodes. In the electrostatic adsorption layer 203 that covers the upper surface of the cylindrical convex portion 202-21 of the sample stage 101 constituting the placement surface of the wafer W, different polarities are imparted to the plurality of electrodes disposed in internal portions corresponding to a plurality of divided regions in the plane.

As a result, charges of different polarities are polarized and formed in a plurality of regions in the wafer W. As a result, it is possible to generate the electrostatic force which adsorbs or supports the wafer W on the electrostatic adsorption layer 203 even in a state where the plasma 43 is not formed in the processing chamber 33.

When the wafer W is carried out of the processing chamber 33 from above the sample stage 101, first, a static elimination step of eliminating the voltage which has been applied to the internal electrode 203-1 holding the wafer W by the electrostatic force is performed in a state where the generation of plasma 43 is stopped inside the processing chamber 33. Thereafter, three lift pins 209 concentrically, disposed at regular intervals when the cylindrical convex portion 202-21 is viewed from above, are raised to be driven by an actuator (not illustrated) to lift the wafer W above the upper surface of the electrostatic adsorption layer 203 to be held at a predetermined distance from the upper surface.

Each of the three lift pins 209 is housed inside the hollow insulating boss 210 mounted in the through-hole 211-3 that has the opening on the upper surface of the electrostatic adsorption layer 203 and penetrates through the electrostatic adsorption layer 203 and the electrode block 202. When being driven by the actuator (not illustrated), the three lift pins 209 are changed from a state where even distal ends thereof are housed inside the through-holes 211-3 (state illustrated in FIG. 2A) to a state where the distal ends protrude upward from the upper surface of the electrostatic adsorption layer 203 to abut on the back surface of the wafer W, and further move upward to a state of causing the wafer W to be separated from the upper surface of the electrostatic adsorption layer 203, thereby lifting the wafer W above the upper surface of the electrostatic adsorption layer 203.

In this state, the arm of the robot arm (not illustrated) enters the processing chamber 33, and a wafer holding portion at a distal end moves to a gap between the wafer W lifted by the lift pin 209 and the electrostatic adsorption layer 203. Thereafter, the lift pin 209 is lowered by an operation of the actuator (not illustrated) and moves below the arm distal end (not illustrated) so that the wafer W is delivered to the wafer holding portion at the arm distal end (not illustrated), and the lift pins 209 are housed inside the hollow insulating bosses 210 mounted in the through-holes 211-3 of the sample stage 101. Thereafter, the arm of the robot arm (not illustrated) contracts so that the wafer W is carried out to the transfer chamber in the vacuum transfer container (not illustrated) outside the processing chamber 33 while being held by the robot arm.

A passage 204-1 inside the electrode block of the heat transfer gas supply passage 204 is installed to penetrate through the inside of a hollow insulating boss 210-2 mounted in a through-hole 211-2 formed in the electrode block 202. In addition, the power supply line 208 is installed to penetrate through the inside of the hollow insulating boss 210-1 mounted in the through-hole 211-1 formed in the electrode block 202. Further, the lift pin 209 is installed inside a hollow insulating boss 210-3 mounted in the through-hole 211-3 formed in the electrode block 202.

The hollow insulating bosses 210-1 to 210-3 mounted in the through-holes 211-1 to 211-3 of the electrode block 202 protect the inside of the through-holes 211-1 to 211-3, and at the same time, have a function of obtaining electrical insulation from the electrode block 202.

The efficiency of heat transfer to the electrode block 202 via the hollow insulating bosses 210-1 to 210-3 mounted in the through-holes 211-1 to 211-3 with a certain gap is significantly smaller than the efficiency of heat transfer inside the electrode block 202. As a result, a distribution of temperature values or the amount of heat transfer tends to locally differ in the in-plane direction of the wafer W positioned above the through-holes 211-1 to 211-3.

In particular, when each thermal conductivity of the insulating bosses 210-1 to 210-3 is lower than the thermal conductivity of the electrode block 202, the transfer of heat flowing from the wafer W to the electrode block 202 via the insulating bosses 210-1 to 210-3 immediately below the wafer W is hindered by the insulating bosses 210-1 to 210-3 in portions of the wafer W positioned immediately above the insulating bosses 210-1 to 210-3.

Ceramics having a low thermal conductivity or the like are used as constituent materials of the insulating bosses 210-1 to 210-3, and the amount of heat transferred from the wafer W to the electrode block 202 via the insulating bosses 210-1 to 210-3 becomes small in the case of mounting the insulating bosses 210-1 to 210-3 in the through-holes 211-1 to 211-3, respectively, with the certain gap. Thus, the deviation of the temperature of the wafer W from the desired temperature range locally increases between the through-holes 211-1 to 211-3 and the electrode block 202 surrounding the through-holes 211-1 to 211-3. A local temperature distribution of the wafer W immediately above the insulating boss 210-3 in such a case is illustrated in a graph 120 of FIG. 2B.

On the other hand, as illustrated in FIG. 2A, the sample stage 101 of the embodiment has the structure in which a structural body in which the electrode block 202 forms the plurality of layers (in the embodiment, two layers of the lower layer 202-1 and the upper layer 202-2) is disposed in the vertical direction and these layers are joined to be integrated. Further, the lower layer 202-1 is made of the material having the higher thermal conductivity than the upper layer 202-1 joined at the upper part, and the refrigerant flow path 11 is disposed inside the upper layer 202-1. That is, thermal conductivities of members constituting the electrode block 202 are set to the relationship of (the lower layer 202-1)>(the upper layer 202-2).

In addition, the insulating bosses 210-1 to 210-3 mounted in the through-holes 211-1 to 211-3 of the electrode block 202 are in close contact with the through-holes 211-11 to 211-31 formed in the lower layer 202-1 in the through-holes 211-1 to 211-3. As a result, the insulating bosses 210-1 to 210-3 are mounted so as to be in thermal contact with the lower layer 202-1. The lower layer 202-1 is made of the material having the higher thermal conductivity than the upper layer 202-2. As examples of the constituent materials, aluminum or copper can be used for the lower layer 202-1, titanium or stainless steel can be used for the upper layer 202-2, aluminum nitride (AlN), boron nitride (BN), or the like can be used for the insulating bosses 210-1 to 210-3.

Figure 2B:
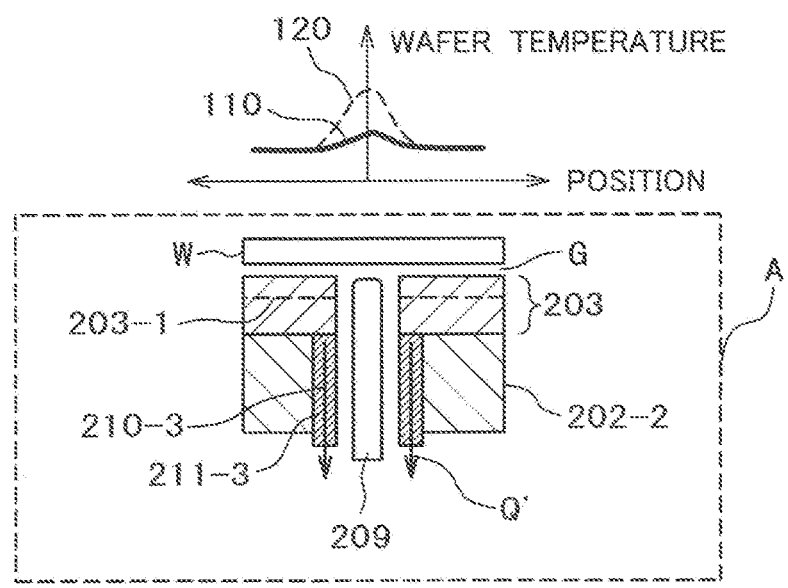
FIG. 2B is a cross-sectional view illustrating details of a part A surrounded by the dotted line in FIG. 2A and a graph illustrating a temperature distribution of a wafer W in such a part.

In the embodiment, the cylindrical insulating bosses 210-1 to 210-3 are fitted in the state of being brought into close contact with inner peripheral wall surfaces of the through-holes 211-11 to 211-31 in the portions penetrating through the lower layer 202-1 in the through-holes 211-1 to 211-3 disposed inside the electrode block 202, whereby the insulating boss and the through-hole are brought into contact with each other As a result, a heat transfer path connecting the wafer W and the refrigerant flow path 11 formed in the lower layer 202-1 reaches the refrigerant flow path 11 via the lower surface of the wafer W, the insulating bosses 210-1 to 210-3 and the lower layer 202-1, and an amount of heat Q' flowing from the wafer W side to the refrigerant flow path 11 side formed in the lower layer 202-1 below the upper layer 202-2 can also be increased as indicated by arrows in FIG. 2B.

In this manner, it is possible to reduce the difference in the amount of heat transfer from the wafer W to the electrode block 202 between portions of the wafer W above the through-holes 211-1 to 211-3 in which the insulating bosses 210-1 to 210-3 having the higher thermal conductivity than the upper layer 202-2 are mounted, and other portions at the upper part of the upper layer 202-2 formed of the material having the lower thermal conductivity than the insulating bosses 210-1 to 210-3.

By adopting such a configuration, the temperature value or the distribution thereof are prevented from locally deviating from other portions in the through-hole and the surroundings thereof more greatly than in other portions with respect to the in-plane direction of the wafer W as compared to the related art.

As a result, a temperature distribution 110 of the wafer W as illustrated in FIG. 2B can be obtained. In the graph illustrating the temperature distribution illustrated in FIG. 2B, it is understood that a peak level is reduced and the uniformity of the in-plane temperature distribution of the wafer W is further improved in the in-plane temperature distribution 110 of the wafer W obtained by the embodiment as compared to a temperature distribution 120 in the case where the embodiment is not applied.

In addition, when the member having the lower thermal conductivity than the lower layer 202-1 is used for the upper layer 202-2, it is possible to set the thermal resistance between a heater and the refrigerant flow path 11 formed inside the lower layer 202-1, which has the relatively high thermal conductivity, to be larger by the upper layer 202-2 having the relatively low thermal conductivity when the heater (not illustrated) is disposed between the upper layer 202-2 and the internal electrode 203-1. As a result, heating energy of the heater (not illustrated) can be efficiently transferred to the wafer W, and it is possible to control the temperature of the wafer W with higher accuracy in a relatively short time.

[First Modification]

Figure 3:
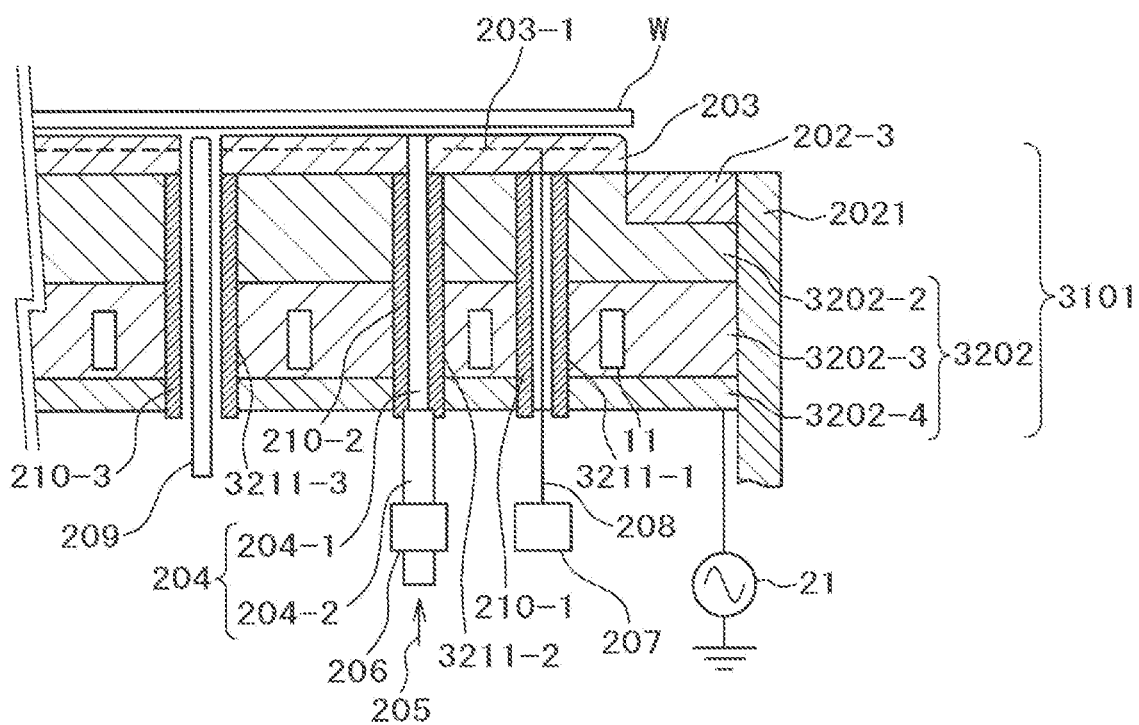
FIG. 3 is a cross-sectional view schematically illustrating an outline of a configuration of a sample stage according to a first modification of the embodiment of the invention.

FIG. 3 is a longitudinal cross-sectional view schematically illustrating an outline of a configuration of a sample stage according to a first modification of the plasma processing apparatus of the embodiment illustrated in FIG. 1. In FIG. 3, the configurations denoted by the same reference numerals as those in FIG. 1, 2A, or 2B will not be described unless necessary.

A sample stage 3101 according to the first modification is constituted by three layers in which three electrode blocks 3202 are joined to be integrated in the vertical direction. Further, a member made of a material having a relatively high thermal conductivity constitutes an intermediate layer 3202-3, and the refrigerant flow path 11 is disposed inside the intermediate layer 3202-3.

Further, a member made of a material having a relatively low thermal conductivity and connected to an upper surface of the intermediate layer 3202-3 is formed as an upper layer 3202-2 above the intermediate layer 3202-3. The upper layer 3202-2 corresponds to the upper layer 202-2 that has been described in the embodiment illustrated in FIGS. 2A and 2B.

Further, a member made of a material having a relatively low thermal conductivity with respect to the intermediate layer 3202-3 is formed as a back surface layer 3202-4 below the intermediate layer 3202-3 in contact with a lower surface of the intermediate layer 3202-3.

Thus, the thermal conductivities of the materials constituting the respective layers have the relationship of (the intermediate layer 3202-3)>(the upper layer 3202-2) and (the intermediate layer 3202-3)>(the back layer 3202-4).

In addition, the insulating bosses 210-1 to 210-3, which are fitted and disposed inside through-holes penetrating through an entire electrode block 3202 so as to be in contact with and cover inner peripheral wall surfaces of the through-holes, are in thermal contact with through-holes 3211-1 to 3211-3 formed in the intermediate layer 3202-3, respectively, which is similar to the case described in the embodiment.

A material having a higher thermal conductivity than the upper layer 3202-2 is adopted as members of the insulating bosses 210-1 to 210-3. As an example of the constituent material, aluminum or copper can be used for the intermediate layer 3202-3, titanium or stainless steel can be used for the upper layer 3202-2 and the back layer 3202-4, and AlN, BN, or the like can be used for the insulating bosses 210-1 to 210-3. As a result, it is possible to increase the amount of heat transferred from the wafer W to the refrigerant flow path 11 via the insulating bosses 210-1 to 210-3 and the intermediate layer 3202-3 and to suppress the uniformity of the in-plane heat exhaust distribution of the wafer W, which is similar to the case of the embodiment.

In this modification, the back surface layer 3202-4 is disposed below the intermediate layer 3202-3 so as to be connected to the intermediate layer 3202-3, whereby it is possible to suppress thermal deformation of the electrode block 3202 having the multi-layer structure. That is, since the back surface layer 3202-4 having a linear expansion coefficient approximately equal to that of the upper layer 3202-2 is disposed below the intermediate layer 3202-3, which is connected to the upper layer 3202-2 below the upper layer 3202-2 and has a larger linear expansion coefficient, it is possible to reduce the warp in the vertical direction generated by a difference in thermal expansion between materials constituting the electrode 3 block 3202 by the upper layer 3202-2 and the back layer 3202-4 vertically sandwiching the intermediate layer 3202-3 and having a relatively small expansion, and it is possible to suppress the deformation of the electrode block 3202 and eventually the deformation of the entire sample stage 3101.

As a result, even when the electrode block 3202 is heated by receiving heat from a heater (not illustrated) disposed between the plasma 43 or the upper layer 3202-2 and the internal electrode 203-1, the relatively large expansion in the in-plane direction of a convex portion of the sample stage 3101 of the intermediate layer 3202-3 or the wafer W placed above the convex portion and the warp in the vertical direction caused by the expansion are reduced, and the deformation of the electrode block 3202 and eventually the deformation of the entire sample stage 3101 are suppressed.

The sample stage 3101 is disposed in the processing chamber 33 where the plasma 43 is formed and is exposed to the plasma 43, and thus, the back surface layer 3202-4 of the electrode block 3202 is desirably made of a material having a high plasma resistance. In the embodiment, titanium or stainless steel, which is the same member as the upper layer 3202-2 and has a higher plasma resistance than aluminum or copper of the intermediate layer 3202-3 is used.

[Second Modification]

Figure 4:
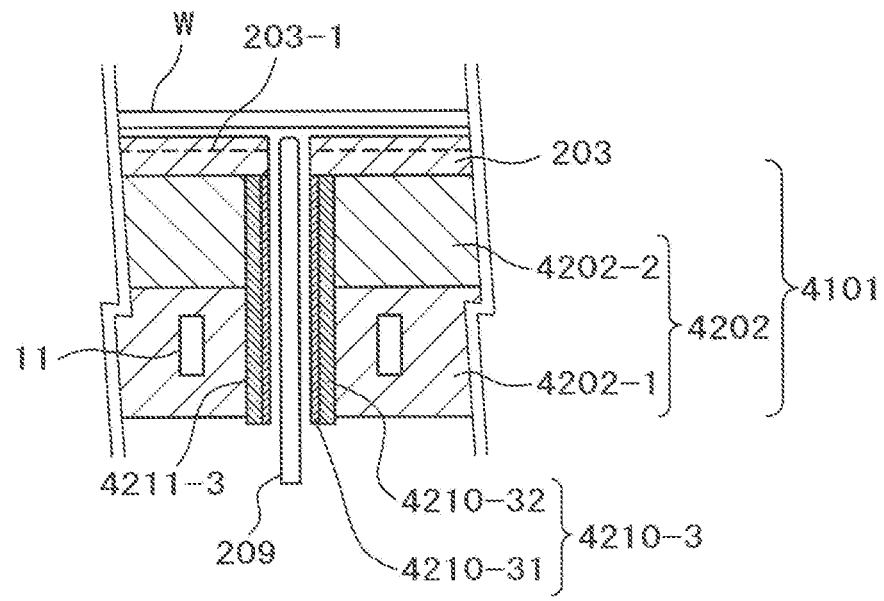
FIG. 4 is a cross-sectional view schematically illustrating an outline of a configuration in the vicinity of a lift pin of a sample stage according to a second modification of the embodiment of the invention.

Next, another configuration of the insulating bosses 210-1 to 210-3 will be described as a second modification of the embodiment of the invention with reference to FIG. 4. FIG. 4 is a view schematically illustrating an outline of the periphery of a portion where the lift pin 209 is installed in a configuration of a sample stage 4101 according to the modification of the plasma processing apparatus described in the embodiment illustrated in FIGS. 2A and 2B.

In the above-described embodiment and first modification, it is required for the insulating bosses 210-1 to 210-3 to have the functions of electrically insulating internal spaces of the insulating bosses 210-1 to 210-3 and the lift pins 209 housed in the spaces from the electrode block 202 or the electrode block 3202 while protecting the inner peripheral walls of the through-holes 211-1 to 211-3 of the electrode block 202 in the embodiment or the inner peripheral walls of the through-holes 3211-1 to 3211-3 of the electrode block 3202 in the first modification.

An insulating boss 4210-3 according to the second modification has a concentric and multiple configuration in which an inner bosses 4210-31 made of a material having a low thermal conductivity but having high insulation property (dielectric constant or relative permittivity) and plasma resistance, and an outer boss 4210-32 made of a material having a higher thermal conductivity but having low insulation property and plasma resistance are arranged such that an outer peripheral wall surface of the inner boss 4210-31 and an inner peripheral wall surface of the outer boss 4210-32 abut on each other.

The outer peripheral wall surface of the outer boss 4210-32 is in close contact with a through-hole 4211-3 formed in a lower layer 4202-1 and an upper layer 4202-2 constituting an electrode block 4202 of the sample stage 4101 to be in thermal contact with the lower layer 4202-1, which is similar as in the case described in the embodiment.

In the insulating boss 4210-3 of this modification, characteristics such as the thermal conductivity, the insulation property, and the plasma resistance required as the insulating boss 4210-3 are assigned to different members, and the required performance as a whole is secured by forming the insulating boss 4210-3 as an integral member using the plurality of materials contrarily different in thermal conductivity and insulation property in contact with each other concentrically.

In this modification, the insulating bosses 210-1 and 210-2 described in the first embodiment also have the same configuration as the insulating boss 4210-3.

[Third Modification]

Figure 5:
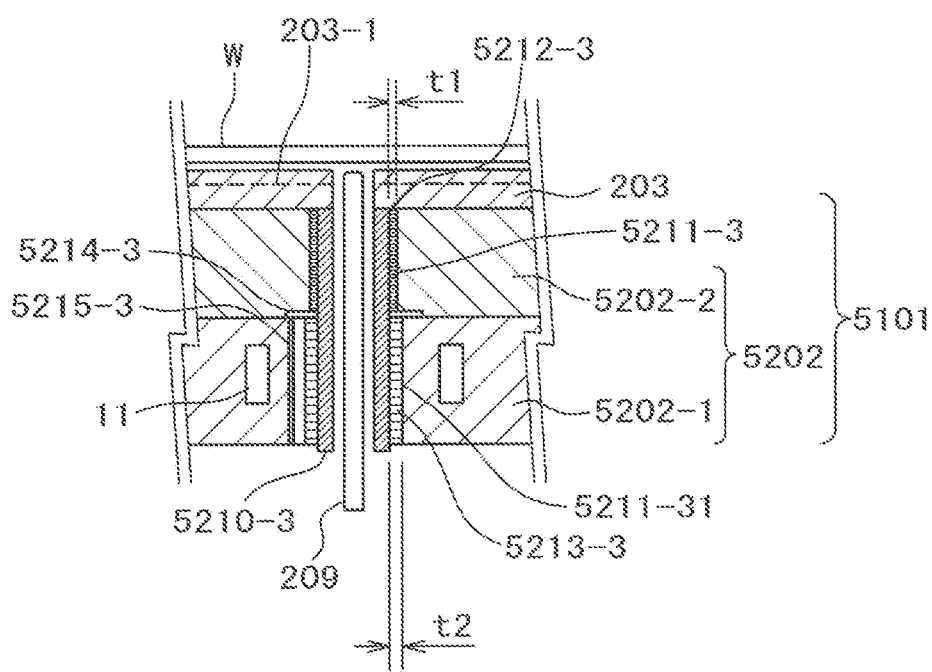
FIG. 5 is a cross-sectional view schematically illustrating an outline of a configuration in the vicinity of a lift pin of a sample stage according to a third modification of the embodiment of the invention.

Next, still another third modification of the embodiment of the invention will be described with reference to FIG. 5. FIG. 5 is a view schematically illustrating an outline of the periphery of a portion where the lift pin 209 is installed in a configuration of a sample stage 5101 of a plasma processing apparatus according to still another modification of the embodiment illustrated in FIGS. 2A and 2B.

As in the embodiment described with reference to FIGS. 2A and 2B, the sample stage 101 is configured to have a multi-layer structure by connecting members made of materials having different linear expansion coefficients in the vertical direction, such as the lower layer 202-1 and the upper layer 202-2, for the electrode block 202 having a relatively high conductivity or thermal conductivity such as metal. In such a case, when heat is applied to the electrode block 202, there is a risk that the cylindrical insulating boss 210 penetrating through the plurality of layers and fitted in close contact with the layers may be broken as a shearing force acts in a direction traversing an axis of the insulating boss due to a difference in magnitude of thermal expansion between the respective layers.

For example, in the embodiment illustrated in FIGS. 2A and 2B, the lower layer 202-1 made of aluminum or copper is formed using the material having a higher linear expansion coefficient than that of the upper layer 202-2 made of titanium or stainless steel. Further, the insulating bosses 210-1 to 210-3 are fitted such that the outer peripheral wall surfaces thereof are in contact with the inner peripheral walls of the through-holes 211-1 to 211-3 of the electrode block 202.

When the plasma 43 is formed and the wafer W is heated in the middle of being processed in such a configuration, thermal expansion occurs in each of the lower layer 202-1 and the upper layer 202-2 of the electrode block 202. At this time, due to a difference between thermal expansion coefficients of both the layers, positions of the through-holes 211-1 to 211-3 formed at positions radially separated from a center portion of the electrode block 202 differ between the lower layer 202-1 which is relatively largely displaced and the upper layer 202-2 whose expansion amount is relatively small and whose displacement amount is relatively small.

As a result, the insulating bosses 210-1 to 210-3 held at the portions inside the upper layer 202-2 whose expansion amount is relatively small and whose displacement amount is relatively small receive a force (shearing force) in a direction toward the outer circumference side of the sample stage 101. As a result, there is a risk that the breakage of the insulating boss 210 may occur when the above difference in expansion exceeds an allowable range.

In the example illustrated in FIG. 5 in the modification, an insulating boss 5210-3 is inserted into a through hole 5211-31 penetrating through a lower layer 5202-1 constituting an electrode block 5202 and a through-hole 5211-3 penetrating through an upper layer 5202-2 so as to be disposed to penetrate through both the layers.

A portion inside the upper layer 5202-2 of the insulating boss 5210-3 having a cylindrical shape is connected between an outer peripheral wall surface thereof and an inner peripheral wall surface of the through-hole 5211-3 formed in the upper layer 5202-2 to be fixed via a hard adhesive layer 5212-3. Constituent materials of the electrode block 5202 are configured such that (a linear expansion coefficient of the lower layer 5202-1)>(a linear expansion coefficient of the upper layer 5202-2).

Further, a portion of the cylindrical insulating boss 5210-3 inside the lower layer 5202-1 is connected to the lower layer 5202-1 with a soft adhesive layer 5213-3 sandwiched in a gap between an outer peripheral wall surface thereof and the inner peripheral wall surface of a through-hole 5211-31 of the lower layer 5202-1, so that a position thereof is fixed.

A size of the gap in the radial direction of the insulating boss 5210-3 is formed such that the gap between the insulating boss 5210-3 and the lower layer 5202-1 is larger than the gap between the insulating boss 5210-3 and the upper layer 5202-2 in a state when the electrode block 5202 including the insulating boss 5210-3 is assembled or before the sample stage 5101 is heated by action from the outside. Further, the soft adhesive layer 5213-3 is sandwiched in the gap between the insulating boss 5210-3 and the lower layer 5202-1 in the through-hole.

With such a configuration, it is possible to realize higher heat transfer between the electrode block 5202 and the insulating boss 5210-3 while suppressing physical interference therebetween caused by the thermal expansion in the sample stage 5101 of the modification. That is, t2>t1 when a size (thickness) of the hard adhesive layer 5212-3 in the radial direction of the insulating boss 5210-3 or the through-hole is t1 and a thickness of the soft adhesive layer 5213-3 is t2.

Further, each hardness of the hard adhesive layer 5212-3 and the soft adhesive layer 5213-3 as the materials is set to have the relationship of (a hardness or rigidity of the hard adhesive layer 5212-3)>(a hardness or rigidity of the soft adhesive layer 5213-3).

As an example of such an adhesive, a resin adhesive or a ceramic adhesive can be used for the hard adhesive layer 5212-3, and a silicone adhesive or the like can be used for the soft adhesive layer 5213-3. Incidentally, it is desirable that the soft adhesive layer 5213-3 be soft and have a high thermal conductivity at the same time, and thus, a filler for heat conduction such as ceramics may be added to increase the thermal conductivity. With such a configuration, the relationship of the thermal conductivities between the respective layers constituting the electrode block 5202 and the insulating boss 5210-3 is set such that (the thermal conductivity between the insulating boss 5210-3 and the soft adhesive layer 5213-3)>(the thermal conductivity between the insulating boss 5210-3 and the hard adhesive layer 5212-3).

In the same manner as described in the first embodiment, the insulating boss 5210-3 is formed using a material having a thermal conductivity higher than a thermal conductivity of a member constituting the upper layer 5202-2, and the lower layer 5202-1 is formed using a material having a thermal conductivity higher than a thermal conductivity of a member constituting the upper layer 5202-2. In the modification, more heat is transferred from the upper layer 5202-2 to the insulating boss 5210-3, a difference in temperature between an upper end of the insulating boss 5210-3 and the surrounding upper layer 5202-2 is suppressed, and it is possible to reduce a local change in temperature of the wafer W above and around the through-hole 5211-3.

In addition, in the step of assembling the sample stage 5101 of the modification, when the soft adhesive layer 5213-3 is disposed between the insulating boss 5210-3 and the inner peripheral wall surface of the through-hole 5211-31 in the lower layer 5202-1 after connecting the insulating boss 5210-3 to the upper layer 5202-2 using the hard adhesive layer 5212-3 to fix the position thereof, a gap is generated between the hard adhesive layer 5212-3 and the soft adhesive layer 5213-3 in a case where the soft adhesive layer 5213-3 is filled from an opening of the through-hole 5211-31 on a lower surface (bottom surface) side of the lower layer 5202-1, and there is a risk that the performance of fixation of the insulating boss 5210 or heat transfer may be impaired by the gap.

In order to suppress such a risk, in the modification, an exhaust groove 5214-3, formed by causing a recessed portion in which at least any joining surface between the through-hole 5211-31 of the lower layer 5202-1 and the through-hole 5211-3 of the upper layer 5202-2 on an outer peripheral side of a boundary portion (on a side of the upper layer 5202-2 in the configuration illustrated in FIG. 5) is recessed to surround the boundary portion in a ring shape, is disposed, and an exhaust hole 5215-3 communicating the exhaust groove 5214-3 and a lower surface side of the electrode block 5202 is provided.

With this configuration, even when the gap between the insulating boss 5210-3 and the inner peripheral wall surface of the through-hole 5211-31 in the lower layer 5202-1 is filled with the soft adhesive layer 5213-3, the generation of a space, which is a so-called void, between the soft adhesive layer 5213-3 and the hard adhesive layer 5212-3 in the gap is suppressed, so that it is possible to dispose the soft adhesive layer 5213-3 around the insulating boss 5210-3, and the fixing of the position of the insulating boss 5210-3 and the efficiency of heat transfer are prevented from being impaired.

Although the configuration of the periphery of the portion where the lift pin 209 is installed has been described in the modification, a member having the same configuration as the insulating boss 5210-3 described with reference to FIG.

5 can be mounted even for the portions to which the insulating bosses 210-1 and 210-2 described in the first embodiment are mounted.

According to the configurations of the embodiment and the modifications described above, it is possible to suppress the generation of the portion (region of the singularity) where the change of the temperature value or the distribution thereof is locally large in the in-plane direction of the wafer W in the middle of being processed, and to improve the yield of axial atomic processing by securing an accurate target value of a desired temperature of the wafer W or the sample stage 5101 in the processing of the wafer W.

Although the plasma processing apparatus that generates the plasma 43 by the ECR using the microwave electric field and the magnetic field has been described in the above embodiment, the invention can be applied without restriction on its operation and effect even if the plasma is formed by another means for forming plasma, for example, by inductive coupling or capacitive coupling.

The sample stage of the vacuum processing apparatus proposed by the invention is not limited to the embodiment of the plasma processing apparatus described above, and can be diverted to other devices that require accurate wafer temperature management while suppressing generation of foreign substances. For example, it is considered that the invention is also advantageous for an asking device, a sputtering device, an ion implantation device, and the like which perform processing while heating a wafer to a high temperature.

What is claimed is:

1. A plasma processing apparatus comprising:
   a processing chamber which is formed using a vacuum container;
   a sample stage which is installed inside the processing chamber and on which an object to be processed is placed;
   a vacuum exhaust unit which includes a vacuum pump and exhausts an inside of the processing chamber to vacuum; and
   a plasma generation unit which includes a power supply and generates plasma inside the processing chamber,
   wherein the sample stage includes:
   a first metallic base material which has a flow path of a refrigerant formed therein;
   a second metallic base material which is disposed above the first metallic base material and has a lower thermal conductivity than the first metallic base material;
   an insulating film layer which is formed using an insulating member covering a surface of the second metallic base material, has an electrode formed therein, and adsorbs the object to be processed, placed on an upper surface of the insulating film layer, by an electrostatic force; and
   a plurality of lift pins which vertically moves the object to be processed with respect to the upper surface of the insulating film layer in a state where the adsorption by the electrostatic force is stopped,
   a plurality of through-holes through which the plurality of the lift pins passes is formed in the first metallic base material, the second metallic base material, and the insulating film layer, and a boss, which electrically insulates the lift pin from the first metallic base material and the second metallic base material and is formed using an insulating member having a higher thermal conductivity than the second metallic base material, is inserted into each of the plurality of through-holes.

2. The plasma processing apparatus according to claim 1, wherein
   in a state where the boss is inserted, a gap between an outer wall surface of the boss and an inner wall surface of the through-hole formed in the second metallic base material is larger than a gap between the outer wall surface of the boss and an inner wall surface of the through-hole formed in the first metallic base material, and the outer wall surface of the boss and an inner wall surface of the first metallic base material are connected with a first adhesive sandwiched in a gap between the outer wall surface of the boss and the inner wall surface of the first metallic base material.

3. The plasma processing apparatus according to claim 2, wherein
   a thermal conductivity of the first adhesive is higher than the thermal conductivity of the second metallic base material.

4. The plasma processing apparatus according to claim 2, wherein
   a rigidity of the first adhesive is smaller than a rigidity of the second metallic base material.

5. The plasma processing apparatus according to claim 3, wherein
   a rigidity of the first adhesive is smaller than a rigidity of the second metallic base material.

6. The plasma processing apparatus according to claim 2, wherein
   the outer wall surface of the boss and the second metallic base material are connected with a second adhesive sandwiched in the gap between the outer wall surface of the boss and the inner wall surface of the through-hole formed in the second metallic base material,
   the plasma processing apparatus further comprising a communication path that communicates a gap between the outer wall surface of the boss and the second metallic base material and an outside of the first metallic base material.

7. The plasma processing apparatus according to claim 3, wherein
   the outer wall surface of the boss and the second metallic base material are connected with a second adhesive sandwiched in the gap between the outer wall surface of the boss and the inner wall surface of the through-hole formed in the second metallic base material,
   the plasma processing apparatus further comprising a communication path that communicates a gap between the outer wall surface of the boss and the second metallic base material and an outside of the first metallic base material.

8. The plasma processing apparatus according to claim 4, wherein
   the outer wall surface of the boss and the second metallic base material are connected with a second adhesive sandwiched in the gap between the outer wall surface of the boss and the inner wall surface of the through-hole formed in the second metallic base material,
   the plasma processing apparatus further comprising a communication path that communicates a gap between the outer wall surface of the boss and the second metallic base material and an outside of the first metallic base material.

9. The plasma processing apparatus according to claim 5, wherein
   the outer wall surface of the boss and the second metallic base material are connected with a second adhesive sandwiched in the gap between the outer wall surface of the boss and the inner wall surface of the through-hole formed in the second metallic base material, the plasma processing apparatus further comprising a communication path that communicates a gap between the outer wall surface of the boss and the second metallic base material and an outside of the first metallic base material.

10. The plasma processing apparatus according to claim 1, wherein the boss has two inner and outer layers, the inner layer formed using a material having a higher insulation property and a lower thermal conductivity than a material of the outer layer.

11. The plasma processing apparatus according to claim 1, wherein the second metallic base material is formed using titanium or a titanium alloy as a material, and the first metallic base material is formed using aluminum or an aluminum alloy as a material.

12. The plasma processing apparatus according to claim 2, wherein the second metallic base material is formed using titanium or a titanium alloy as a material, and the first metallic base material is formed using aluminum or an aluminum alloy as a material.

13. The plasma processing apparatus according to claim 11, wherein the boss is formed using aluminum nitride as a material.

* * * * *